United States Patent
Eisert et al.

(10) Patent No.: US 7,943,944 B2
(45) Date of Patent: May 17, 2011

(54) GAN-BASED RADIATION-EMITTING THIN-LAYERED SEMICONDUCTOR COMPONENT

(75) Inventors: Dominik Eisert, Regensburg (DE); Berthold Hahn, Hemau (DE); Volker Härle, Laaber (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 778 days.

(21) Appl. No.: 10/523,551

(22) PCT Filed: Jun. 20, 2003

(86) PCT No.: PCT/DE03/02071
§ 371 (c)(1),
(2), (4) Date: Oct. 18, 2005

(87) PCT Pub. No.: WO2004/017430
PCT Pub. Date: Feb. 26, 2004

(65) Prior Publication Data
US 2006/0097271 A1    May 11, 2006

(30) Foreign Application Priority Data
Jul. 31, 2002   (DE) .................................. 102 34 977

(51) Int. Cl.
*H01L 29/22*   (2006.01)
*H01L 29/24*   (2006.01)
(52) U.S. Cl. ................ 257/98; 257/81; 257/91; 257/95; 257/99; 257/100; 257/79
(58) Field of Classification Search .................... 257/91, 257/95, 98–100, 81, 79; 438/22, 39, 455, 438/940
See application file for complete search history.

(56) References Cited

U.S. PATENT DOCUMENTS

| | | | |
|---|---|---|---|
| 4,122,486 A * | 10/1978 | Ono et al. | 257/95 |
| 5,200,668 A | 4/1993 | Ohashi et al. | |
| 5,633,527 A | 5/1997 | Lear | |
| 5,779,924 A | 7/1998 | Krames et al. | |
| 5,792,698 A * | 8/1998 | Nishitani | 438/287 |

(Continued)

FOREIGN PATENT DOCUMENTS
DE   198 07 758 A1   12/1998
(Continued)

OTHER PUBLICATIONS

I. Schnitzner et al., "30% External Quantum Efficiency from Surface Textured LEDs", Applied Physics Letters, Oct. 1993, vol. 63, pp. 2174-2176.

(Continued)

*Primary Examiner* — Kenneth A Parker
*Assistant Examiner* — Joseph Nguyen
(74) *Attorney, Agent, or Firm* — Cohen Pontani Lieberman & Pavane LLP

(57) ABSTRACT

A radiation-emitting thin-film semiconductor component with a multilayer structure (12) based on GaN, which contains an active, radiation-generating layer (14) and has a first main area (16) and a second main area (18)—remote from the first main area—for coupling out the radiation generated in the active, radiation-generating layer. Furthermore, the first main area (16) of the multilayer structure (12) is coupled to a reflective layer or interface, and the region (22) of the multilayer structure that adjoins the second main area (18) of the multilayer structure is patterned one- or two-dimensionally.

32 Claims, 5 Drawing Sheets

U.S. PATENT DOCUMENTS

| | | | |
|---|---|---|---|
| 6,091,085 A | 7/2000 | Lester | |
| 6,111,272 A * | 8/2000 | Heinen | 257/94 |
| 6,229,160 B1 | 5/2001 | Krames et al. | |
| 6,258,618 B1 | 7/2001 | Lester | |
| 6,291,839 B1 * | 9/2001 | Lester | 257/91 |
| 6,346,771 B1 | 2/2002 | Salam | |
| 6,410,942 B1 * | 6/2002 | Thibeault et al. | 257/88 |
| 6,445,010 B1 | 9/2002 | Ebeling | |
| 6,504,180 B1 * | 1/2003 | Heremans et al. | 257/98 |
| 6,515,310 B2 * | 2/2003 | Yamazaki et al. | 257/98 |
| 6,649,939 B1 | 11/2003 | Wirth | |
| 6,693,021 B1 | 2/2004 | Motoki et al. | |
| 6,730,939 B2 | 5/2004 | Eisert et al. | |
| 6,878,563 B2 | 4/2005 | Bader et al. | |
| 7,064,355 B2 * | 6/2006 | Camras et al. | 257/98 |
| 7,294,866 B2 * | 11/2007 | Liu | 257/100 |
| 2002/0017652 A1 | 2/2002 | Illek et al. | |
| 2002/0134986 A1 * | 9/2002 | Kamemura et al. | 257/98 |
| 2003/0127654 A1 | 7/2003 | Eisert et al. | |
| 2003/0141496 A1 | 7/2003 | Illek et al. | |
| 2003/0178626 A1 | 9/2003 | Sugiyama et al. | |
| 2004/0026709 A1 | 2/2004 | Bader et al. | |
| 2004/0033638 A1 | 2/2004 | Bader et al. | |
| 2004/0046179 A1 | 3/2004 | Baur et al. | |
| 2006/0097271 A1 | 5/2006 | Eisert et al. | |

FOREIGN PATENT DOCUMENTS

| | | |
|---|---|---|
| DE | 199 11 717 A1 | 9/2000 |
| DE | 199 43 406 C2 | 7/2001 |
| DE | 100 06 738 | 9/2001 |
| DE | 100 20 464 A1 | 11/2001 |
| DE | 100 26 255 | 11/2001 |
| DE | 100 51 465 | 5/2002 |
| DE | 101 11 501 | 9/2002 |
| EP | 0 905 797 A2 | 8/1998 |
| EP | 1 263 058 A2 | 5/2002 |
| EP | 1 271 665 A2 | 6/2002 |
| EP | 1 471 583 | 10/2004 |
| JP | 8-288543 | 11/1996 |
| JP | 10-4209 | 1/1998 |
| JP | 10-163525 | 6/1998 |
| JP | 11-274568 | 10/1999 |
| JP | 2000-91639 | 3/2000 |
| JP | 2000174339 | 6/2000 |
| JP | 2000-196152 | 7/2000 |
| JP | 2001-168387 | 6/2001 |
| JP | 2002-185037 | 6/2002 |
| JP | 2003-174195 | 6/2003 |
| WO | WO 90/05998 | 5/1990 |
| WO | WO 96/26550 | 8/1996 |
| WO | WO 96/37000 | 11/1996 |
| WO | WO 99/14797 | 3/1999 |
| WO | WO 00/60648 | 10/2000 |
| WO | WO 01/41225 A | 6/2001 |
| WO | WO 01/61765 A1 | 8/2001 |
| WO | WO 02/41406 A1 | 5/2002 |
| WO | WO 03/065464 | 8/2003 |

OTHER PUBLICATIONS

R. Windisch et al., "High-Efficiency Surface-Textured LEDs", Compound Semiconductor 6 (4) 2000, IMEC, Leuven, Belgium, pp. 55-58.

J. Cao et al., "Improved quality GaN by growth on compliant silicon-on-insulator substrates using metalorganic chemical vapor deposition", Applied Physics Letters, 83(7) 1998 pp. 3829-3834 (Univ. of Michigan).

A.J. Steckel, "Growth and Characterization of GaN Thin Films on SiC SOI Substrates", Journal of Electron. Mat. 26(3) 1997, pp. 217-223.

W.S. Wong, "Integration of GaN Thin Films with Dissimilar Substrate Materials by Pd-In Metal bonding and laser Lift-off", Journal of Electron. Mat. 28(12) 1999, pp. 1409-1413 (Univ. of California, Berkeley).

Y.K. Song, "Resonant-cavity InGaN quantum-well blue light-emitting diodes", Applied Physics Letters 77(12) 2000, pp. 1744-1746 (Brown University, Agilent).

David S. Ginley et al., "Transparent Conducting Oxides", MRS Bulletin, vol. 25(8), Aug. 2000, pp. 15-21.

* cited by examiner

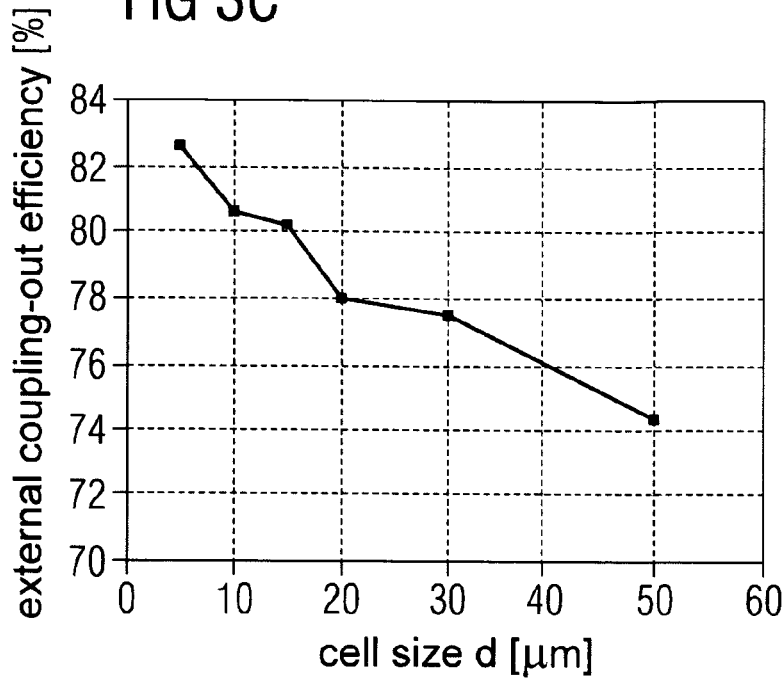
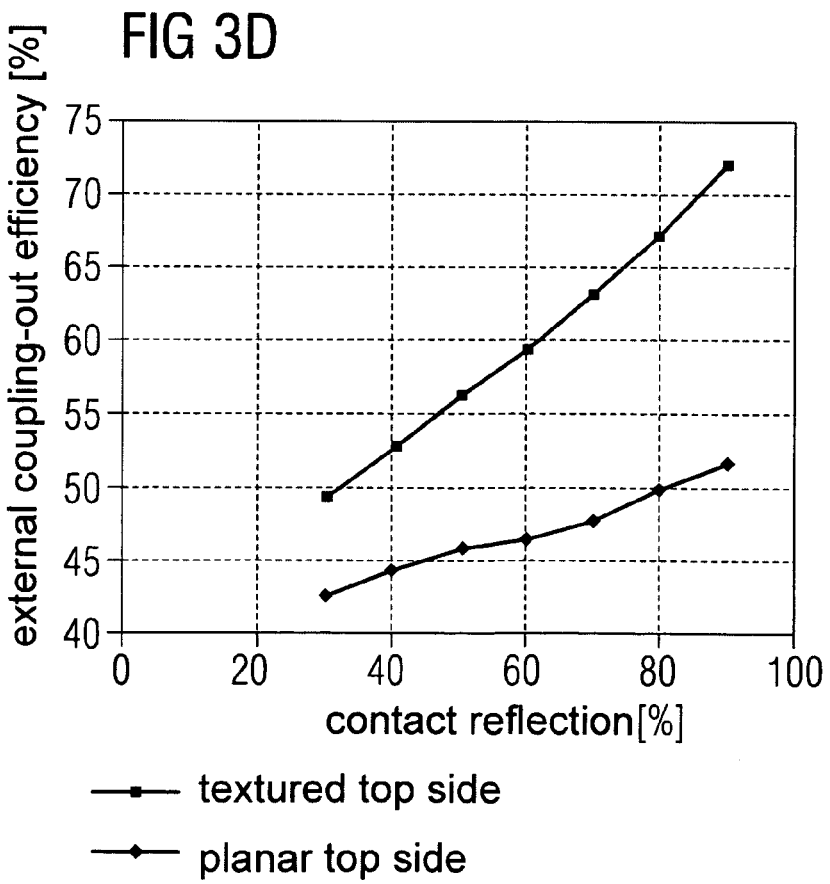

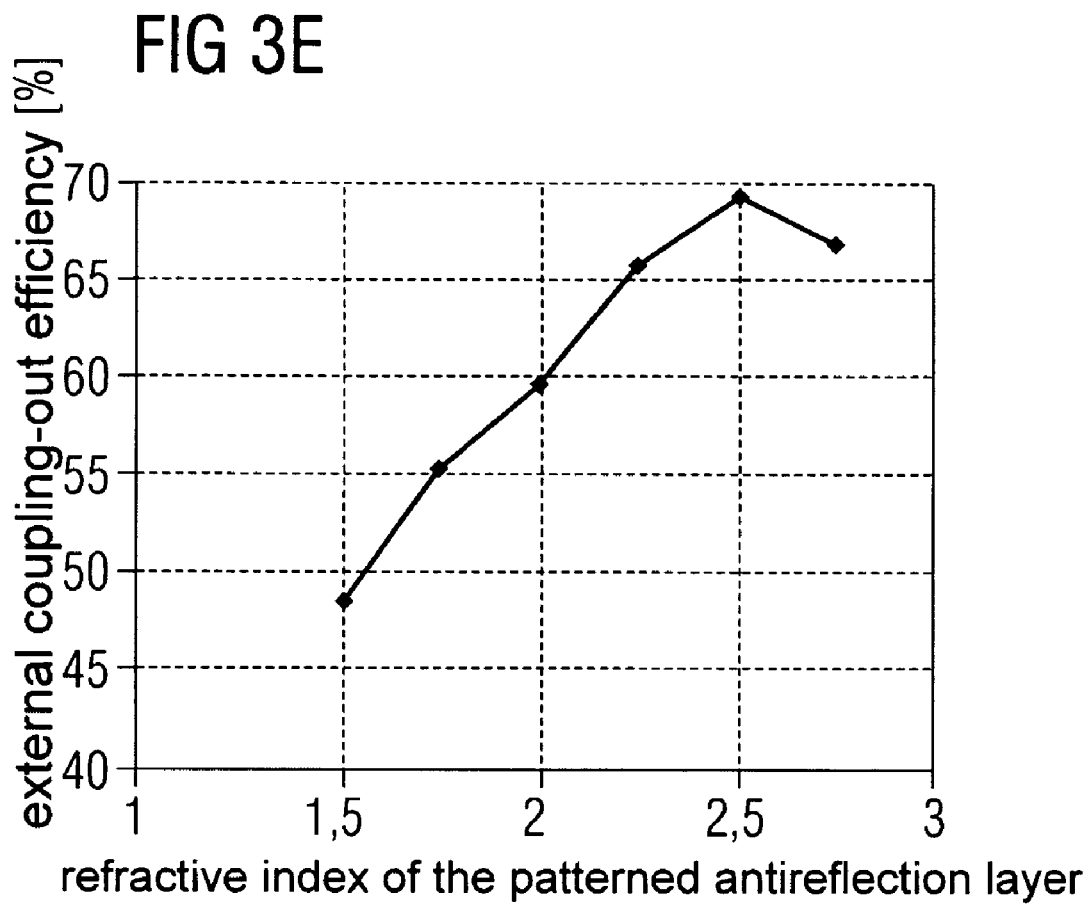
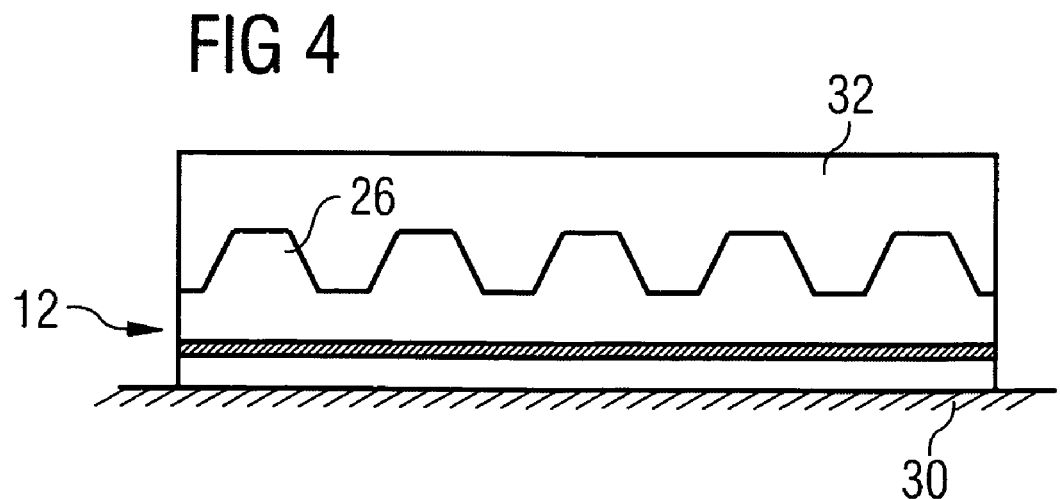

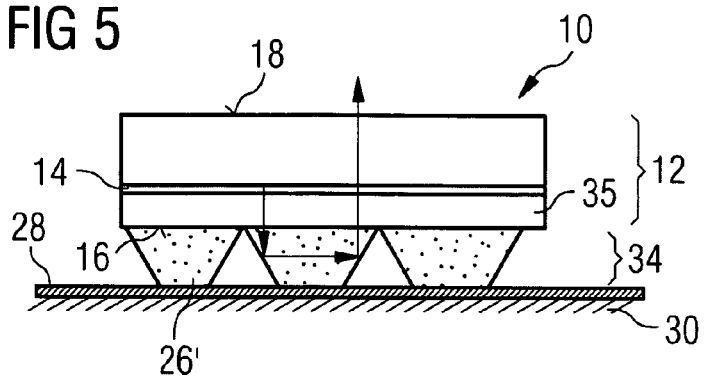
FIG 5
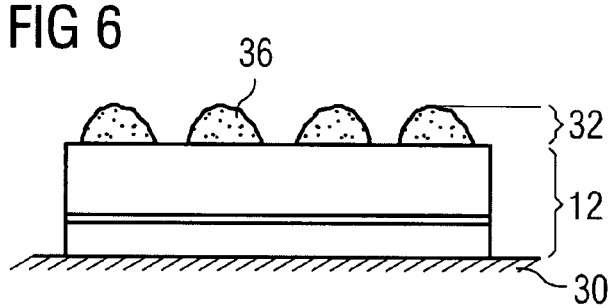
FIG 6
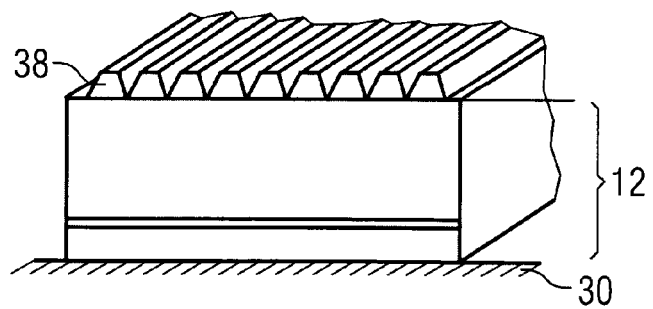
FIG 7
FIG 8 Prior Art
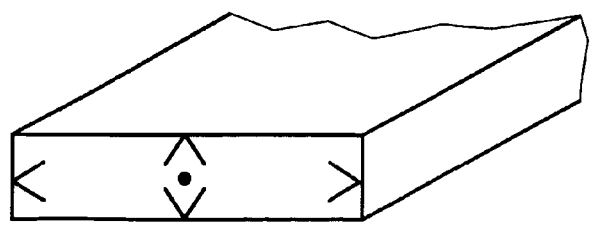

GAN-BASED RADIATION-EMITTING THIN-LAYERED SEMICONDUCTOR COMPONENT

RELATED APPLICATIONS

This is a U.S. national stage of application No. PCT/DE2003/002071, filed on Jun. 20, 2003.

This patent application claims the priority of German patent application no. 102 34 977.0, filed Jul. 31, 2002, the disclosure content of which is hereby incorporated by reference.

FIELD OF THE INVENTION

The present invention relates to radiation-emitting thin-film semiconductor components based on GaN.

BACKGROUND OF THE INVENTION

Conventional radiation-emitting semiconductor components often have a rectangular shape for reasons of production technology. The semiconductor components generally comprise a multilayer structure with an active, radiation-generating layer, said multilayer structure being deposited epitaxially on a carrier substrate. The carrier substrate is preferably electrically conductive in order to enable a vertical current flow. Moreover, it is expedient in many cases if the carrier substrate is transparent to the radiation generated in the active layer of the multi-layer structure. However, a high transparency is often at odds with a high electrical conductivity of the material for the carrier substrate. Thus, by way of example, sapphire used for GaN-based light-emitting diodes is transparent to blue light but is not electrically conductive. By contrast, although silicon carbide as carrier substrate for GaN light-emitting diodes is conductive and transparent, the transparency decreases as the conductivity increases, with the result that the properties of the semiconductor component are not ideal in this case either.

Therefore, one possibility for reducing the absorption losses and thus for increasing the external efficiency is the removal of the carrier substrate and to apply suitable mirror layers to the component (thin-film concept). However, a semiconductor thin film is essentially a co-planar plate whose coupling-out efficiency is not increased compared with a standard diode on account of the geometry. Particularly if a carrier substrate exhibiting only little absorption (for example GaN on SiC) has already been used for the semiconductor component, the increase in the external efficiency of the thin-film semiconductor component is too small to justify the increased technical effort for removing the carrier substrate.

In order to elucidate the problem area of coupling out radiation, FIG. 8 schematically shows a semiconductor component with the cones of coupling out radiation. Radiation can be coupled out of the semiconductor component only from a cone with an aperture angle of $\theta = \sin^{-1}(\pi_{ext}/\pi_{int})$, where $\pi_{int}$ denotes the refractive index of the semiconductor material and $\pi_{ext}$ denotes the refractive index of the surroundings. For a GaN semiconductor ($\pi_{int}=2.5$), the coupling-out angle $\theta$ is 23° with respect to air ($\pi_{ext}=1$) and 37° with respect to a plastic encapsulation ($\pi_{ext}=1.5$). Radiation that is generated in the semiconductor component and does not impinge on the interfaces within a cone is finally reabsorbed and converted into heat. Although the coupling-out cone is large for GaN systems in comparison with GaAs systems ($\pi_{int}=3.5$), it nevertheless leads to undesirably high radiation losses.

These conditions also do not change significantly with altered layer thicknesses. However, the thin-film geometry is expedient for the beam coupled out via the top side since the absorption is low on account of the short path in the semiconductor; for the beam coupled out laterally, by contrast, the efficiency may even be lower on account of the multiple reflections in the semiconductor.

Therefore, there are already various approaches for increasing the external efficiency of semiconductor components through altered geometries. Mention shall be made here, in particular, of a so-called micropatterning of the entire multilayer structure, which leads to an intensified lateral coupling out of radiation on account of the larger total area of the side areas of the multilayer structure. In addition, the side areas of the individual multilayer structures thus produced may be beveled. Examples of such semi-conductor components are disclosed in DE-A-198 07 758, (corresponding to U.S. Pat. No. 6,229,160) EP-A-0 905 797 (corresponding to U.S. Pat. No. 6,111,272) or JP-A-08-288543.

A further possibility for increasing the coupling out of radiation is shown in FIGS. 3 and 5 of DE-A-199 11 717. Here, the multilayer structure with the active, radiation-generating layer is assigned individual radiation coupling-out elements in the form of sphere segments or truncated cones formed for example by means of corresponding etching of grown layers.

However, none of the documents cited with respect to the prior art deals with GaN-based thin-film semi-conductor components. GaN-based semiconductor components predominantly serve for generating radiation in the blue-green spectral range and have a plurality of layers comprising a GaN-based material. In the context of this invention, a GaN-based material is understood to mean not only GaN itself but also materials derived from GaN or related to GaN and also ternary or quaternary mixed crystals based thereon. What are included in particular in this respect are the materials GaN, AlN, InN, $Al_{1-x}Ga_xN$, $In_{1-x}Ga_xN$, $In_{1-x}Al_xN$ and $Al_{1-x-y}In_xGa_yN$ where $0<x<1$, $0<y<1$ and $x+y \leq 1$.

SUMMARY OF THE INVENTION

One object of the present invention is to provide a radiation-emitting thin-film semiconductor component based on GaN which has an improved external efficiency of coupling out radiation.

This and other objects are attained in accordance with one aspect of the present invention directed to a multilayer structure based on GaN, which contains an active, radiation-generating layer and has a first main area and a second main area—remote from the first main area—for coupling out the radiation generated in the active, radiation-generating layer. Furthermore, the first main area of the multilayer structure is coupled to a reflective layer or interface, and the region of the multilayer structure that adjoins the second main area of the multilayer structure is patterned one- or two-dimensionally.

The increase in the external efficiency of coupling out radiation is based on breaking the right-angled geometry of the thin-film semiconductor component by patterning the semiconductor thin film itself. The increase in efficiency is verified with the aid of simulations in the context of the detailed description below.

The region of the multilayer structure that adjoins the second main area of the multilayer structure can have convex elevations in the form of truncated pyramids, truncated cones, cones or sphere segments (two-dimensional patterning) or with a trapezoidal, triangular or circle segment cross-sectional form (one-dimensional patterning).

In one embodiment, the aperture angle of the elevations lies between approximately 30° and approximately 70°, and preferably between approximately 40° and approximately 50°. Moreover, the height of the elevations is at least as large, preferably approximately twice as large, as the height of a plane region of the multilayer structure between the active, radiation-generating layer and the elevations. The grid dimension of the elevations is chosen to be at most approximately five times, preferably at most approximately three times, as large as the height of the elevations.

The layer or interface coupled to the first main area of the multilayer structure advantageously has a degree of reflection of at least 70%, and better of at least 85%.

The multilayer structure may be applied either by its first main area directly or via a reflective layer on a carrier substrate, the reflective layer or the carrier substrate also serving as a contact area of the semi-conductor component.

As compensation of a limited transverse conductivity of the thin semiconductor layer, a conductive, transparent layer may be applied on the second main area of the multilayer structure.

In order to afford protection against external influences, a transparent protective or antireflection layer may be applied on the second main area of the multilayer structure.

This radiation-emitting thin-film semiconductor component according to the invention likewise has a multilayer structure based on GaN, which contains an active, radiation-generating layer and has a first main area and a second main area—remote from the first main area—for coupling out the radiation generated in the active, radiation-generating layer. The first main area of the multilayer structure is once-again coupled to a reflective layer or interface. A transparent layer is provided between the first main area of the multilayer structure and the reflective layer or interface, said transparent layer being patterned one- or two-dimensionally.

The patterning of this transparent layer between the multilayer structure and the reflective layer or interface has the same effect as the patterning of the multilayer structure itself and increases the external efficiency of coupling out radiation in the same way.

The transparent layer is preferably conductive in order to compensate for the limited transverse conductivity of a thin multilayer structure.

The transparent layer between the first main area of the multilayer structure and the reflective layer or interface has convex elevations preferably in the form of truncated pyramids or truncated cones (two-dimensional patterning) or a trapezoidal cross-sectional form (one-dimensional patterning).

In one embodiment, said elevations have an aperture angle of between approximately 30° and approximately 70°, preferably between approximately 40° and approximately 50°. In this case, the height of the elevations is chosen to be at least as large, preferably approximately twice as large, as the height of a plane region of the multilayer structure between the active, radiation-generating layer and the elevations, and the grid dimension of the elevations is at most five times, preferably at most three times, the height of the elevations.

The layer or interface coupled to the first main area of the multilayer structure preferably has a degree of reflection of at least 70%, particularly preferably of at least 85%.

The reflective layer may be applied on a carrier substrate or the reflective interface is formed by a carrier substrate, the reflective layer or the carrier substrate also serving as a contact area of the semiconductor component.

BRIEF DESCRIPTION OF THE DRAWINGS

FIGS. 3A to 3D show results of various simulations for elucidating various optimal parameters of the elevations of the semiconductor component from FIG. 1;

FIG. 3E shows the external coupling-out efficiency as a function of the refractive index of the antireflection layer for the embodiment of FIG. 6.

FIG. 4 shows a schematic illustration of a modification of the first exemplary embodiment from FIG. 1;

FIG. 5 shows a schematic illustration of a second exemplary embodiment of a semiconductor component according to the present invention in section;

FIG. 6 shows a schematic illustration of a further modification of the first exemplary embodiment from FIG. 1;

FIG. 7 shows a schematic illustration of yet another modification of the first exemplary embodiment from FIG. 1; and FIG. 8 shows a highly diagrammatic illustration with regard to coupling out radiation from conventional semiconductor components.

DETAILED DESCRIPTION OF THE DRAWINGS

Figure 1:
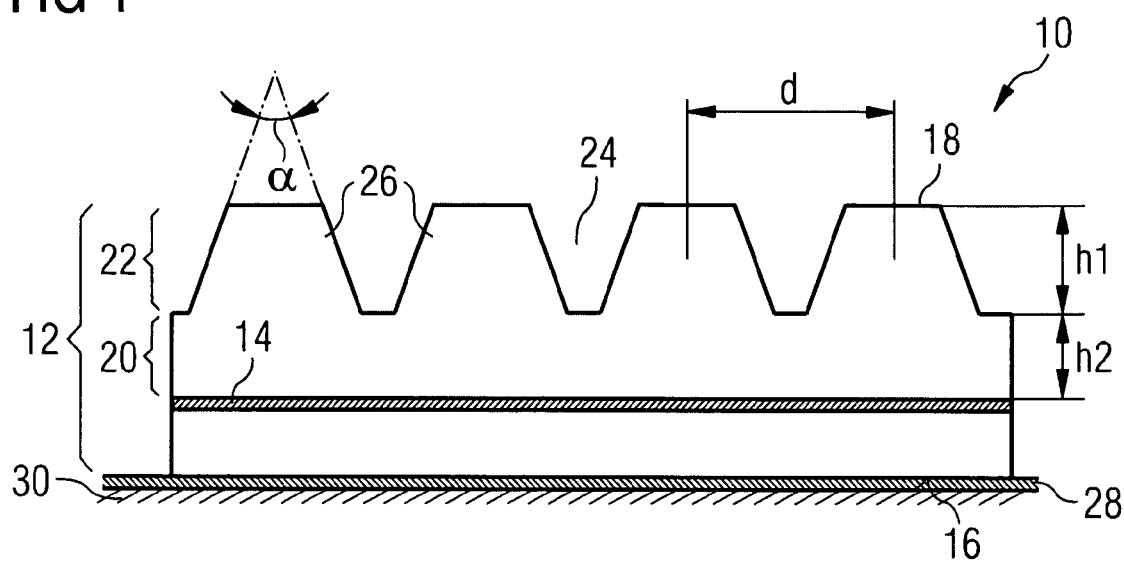
FIG. 1 shows a schematic illustration of a first exemplary embodiment of a semiconductor component according to the present invention in section.

FIG. 1 illustrates a first preferred exemplary embodiment of a thin-film semiconductor component according to the present invention. A main constituent part of the semiconductor component 10 is a multilayer structure 12 based on GaN, which contains an active, radiation-generating layer 14. The multilayer structure 12 is grown epitaxially in a customary manner and contains, in a known manner, a plurality of GaN-based layers.

The multilayer structure 12 has a first main surface area 16 and a second main surface area 18 remote from the first main area, the radiation generated in the active, radiation-generating layer 14 finally being coupled out of the semiconductor component 10 through the second main surface area 18. In the exemplary embodiment shown, the active layer 14 is positioned nearer to the first main surface area 16 than to the second main area surface 18 of the multilayer structure 12. However, the present invention is in no way restricted to this. Rather, the active layer 14 may also be formed centrally in the multilayer structure 12 or nearer to the second main surface area 18. The position chosen in FIG. 1 is advantageous, however, for the patterning of the multilayer structure that is in accordance with the invention and is described below, since a thicker portion of the multilayer structure 12 is available for the patterning.

The multilayer structure 12 is applied via a reflective layer 28, preferably comprising an electrically conductive material, on a carrier substrate 30 made, for example, of sapphire, Si or SiC. The reflective layer 28 may be formed for example as a metallic contact area made of Ag, Al or an Ag or Al alloy or alternatively as dielectric mirror-coating comprising a plurality of dielectric layers. In an alternative embodiment, the multilayer structure 12 may also be applied directly on the carrier substrate 30, in this case the material of the carrier substrate 30 being selected in such a way that the interface between multilayer structure 12 and carrier substrate 30 is reflective.

As is clearly discernable in FIG. 1, the region of the multilayer structure 14 above the active layer 12 can be subdivided essentially into a plane region 20 adjoining the active layer 14 and a patterned region 22 adjoining the second main surface area 18. The multilayer structure 12 is patterned for example by means of customary lithography and/or etching methods at the epitaxially grown semiconductor layers, by means of which groovelike recesses or depressions 24 are formed, between which corresponding elevations 26 remain.

The patterning of the multilayer structure 12 may be formed either one-dimensionally, that is to say with depressions 24 in only one coordinate direction of the plane of the second main surface area 18, or two-dimensionally, that is to say with depressions 24 in two coordinate directions—preferably running perpendicular to one another—of the plane of the second main surface area 18. The elevations 26 produced between the depressions 24 are usually shaped in convex fashion. In this case, one-dimensional patternings are formed by way of example with a trapezoidal (see FIG. 1), triangular, circle segment or hemispherical cross-sectional form and two-dimensional patternings are correspondingly formed in the form of truncated pyramids, truncated cones, cones, sphere segments or hemispheres.

The elevations 26 in the form of truncated pyramids illustrated in FIG. 1 have an aperture angle α, the definition of which can also be applied correspondingly to the other forms of the elevations 26 mentioned. On account of the convexly shaped elevations 26, the radiation generated in the active layer 14 is possibly reflected multiply at the interfaces of the multilayer structure 12 until the radiation finally impinges, in the radiation coupling-out cone dependent on the refractive indices of the materials and the surroundings, on the second main area 18 or the bottom of the depressions 24 and can thus couple out.

Figure 2A:
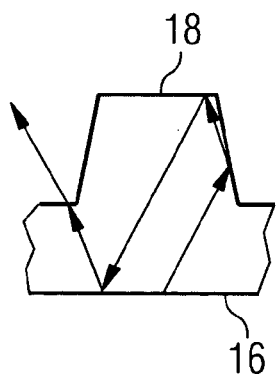
FIGS. 2A to 2C show schematic illustrations for elucidating the optimum aperture angle of the elevations of the semiconductor component from FIG. 1.
Figure 2B:
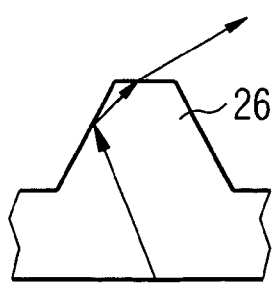
Figure 2C:
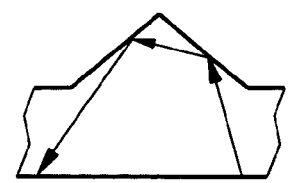

As illustrated in FIGS. 2A to 2C, the efficiency of coupling out radiation depends on the aperture angle α of the elevations 26. Very steep sidewalls, as in FIG. 2A, increase the surface area of the device and are thus expedient for coupling out radiation, but the number of optical modes that are not coupled out due to total reflection is not reduced in the case of very steep sidewalls. Likewise, the sidewalls of the elevations 26 should not be chosen to be too shallow, as illustrated in FIG. 2C, since in this case the deviation from the plane-parallel plate is only small and a large number of multiple reflections occur before coupling out of the radiation. These multiple reflections affect the efficiency of the device in a negative way due to absorption of the radiation within the component.

A medium angular range of the aperture angle α of the elevations 26 as illustrated in FIG. 2B is the most expedient. With this choice of the aperture angle α, the radiation that undergoes total reflection from one facet of the elevation 26 can be coupled out within the radiation coupling-out cone upon impinging on the next facet of the elevation 26, thereby keeping down the number of multiple reflections in the multilayer structure.

Figure 3A:
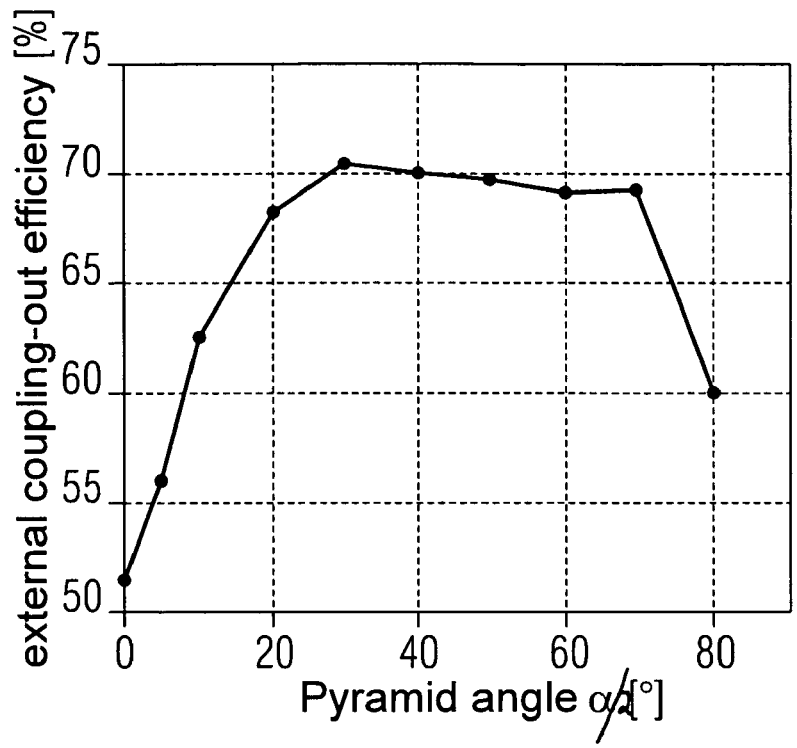

This estimation is also confirmed by a simulation, the result of which is shown in FIG. 3A. In this case, the pyramid angle α/2 (where α is an aperture angle) of the elevations 26 in truncated pyramid form is plotted on the abscissa, and the external efficiency of coupling out radiation is plotted on the ordinate. It is clearly evident that the best efficiency is achieved in a range of pyramid angle between approximately 30° and approximately 70°, more precisely between approximately 40° and approximately 50°. The efficiency of coupling out radiation falls significantly for values of the pyramid angle above 70° and below 30°. A pyramid angle in the range around approximately 45° is thus preferable.

A further parameter that influences the external efficiency of coupling out radiation is the height h1 of the elevations 26. In order to obtain a high efficiency, the height h1 of the elevations 26 should be chosen to be at least as large as the height h2 of the plane region 20 adjoining the active layer 14. Preferably, the elevations 26 are formed twice as high as the plane region 20. A further increase in the height of the elevations 26 does not yield a further increase in the coupling out of radiation.

Figure 3B:
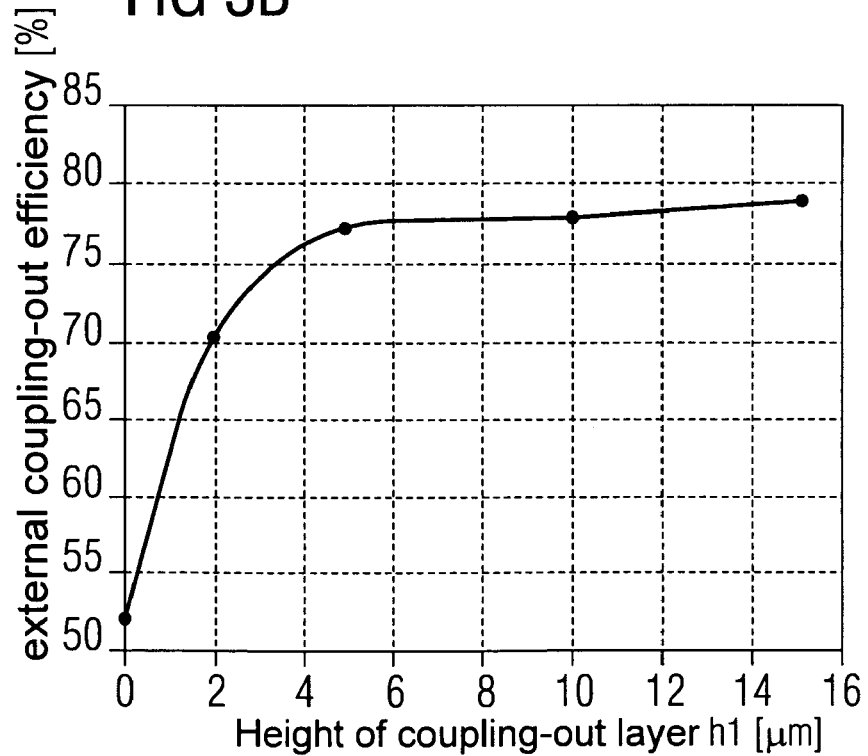

This is confirmed by a simulation illustrated in FIG. 3B. The simulation result shows, for a plane region 20 having a height h2 of approximately 2 µm, the external efficiency of coupling out radiation against the height h1 of the elevations 26. At a height h1 of the elevations 26 below 2 µm, i.e. smaller than the height h2 of the plane region 20, radiation is coupled out only inadequately, while a significant increase in the efficiency is no longer discernable at heights h1 of the elevations 26 greater than approximately 4 µm.

Furthermore, elevations 26 having relatively small lateral dimensions are also preferable. As shown by the simulation result of FIG. 3C, a grid dimension d of the elevations of at most approximately four to five times the height h1 of the elevations 26, preferably only of approximately one to three times the height h1 of the elevations, is advantageous for a good efficiency.

Since the concept of the thin-film semiconductor components is also based on multiple reflections, inter alia, the reflectivity of the rear side of the device, that is to say of the reflective layer 28 or of the reflective interface, likewise influences the external efficiency of the semiconductor component. It is evident in the diagram of FIG. 3D that, in the case of a conventional planar thin film, the efficiency of coupling out radiation depends only to a small extent on the reflectivity of the rear-side contact area (lower curve in FIG. 3D. For a patterned multilayer structure 12 as in FIG. 1, however, the efficiency greatly depends on the reflectivity of the reflective layer 28 or interface (upper curve in FIG. 3D) and should be chosen as far as possible to be above 70%, preferably above 85%.

FIG. 4 illustrates a modification of the semiconductor component from FIG. 1. The difference between the two embodiments is that a protective or antireflection layer 32 is provided on the patterned second main surface area 18 of the multilayer structure 12. Said protective layer 32 is intended to protect the semiconductor from external influences, on the one hand, and the protective layer 32 may, on the other hand, act as an antireflective coating given a suitable choice of refractive index and thickness.

As a further variant of the first exemplary embodiment of the semiconductor component, a transparent, conductive layer (such as layer 32 shown in FIG. 4) with the lowest possible contact resistance with respect to the semiconductor may be provided on the patterned second main surface area 18 of the multilayer structure 12. Such a transparent, conductive layer makes it possible to compensate for the disadvantage that the patterning of the multilayer structure for increasing the efficiency of coupling out radiation at the same time reduces its transverse conductivity. An optimum current supply to all regions of the semiconductor component is obtained without impairing the coupling-out of radiation from the multilayer structure by metal contacts on the latter.

The transparent, conductive layer comprises, by way of example, ZnO, SnO, InO, CdO, GaO or a combination thereof. These materials exhibit an n-type or p-type conductivity and can be deposited by means of sputtering methods, CVD methods or vapor deposition.

A second exemplary embodiment of a radiation-emitting semiconductor component according to the invention is illustrated in FIG. 5.

The thin-film semiconductor component 10 has a multilayer structure 12 based on GaN with an active, radiation-generating layer 14. In contrast to the first exemplary embodiment described above, however, the second main area 18 of the multilayer structure 12, through which the radiation generated in the active layer 14 is finally coupled out, is not patterned here. Rather a transparent layer 34 is provided between the first main area 16 and the reflective layer or interface on the carrier substrate 30, said transparent layer being patterned in order to increase the coupling out of radiation. If metals which make a good electrical contact to the multiplayer structure 12 are not particularly highly reflective (e.g., platinum on p-doped GaN) transparent layer 34 is advantageous since a metal which would not make such good contact with the material of multiplayer structure 12 and which is highly reflective can be used. For example, silver can be used as a reflective layer which would otherwise, if applied directly on multilayer structure 12, yield a contamination of the semiconductor due to migration, e.g., of silver ions into the semiconductor material.

In order to compensate for a lower transverse conductivity of the thin-film semiconductor, it is advantageous for the transparent layer 34 to be formed from a conductive material.

The patterning essentially corresponds to that described above on the basis of the first exemplary embodiment. However, the convex elevations 26' that are appropriate here are primarily those in the form of truncated pyramids or truncated cones or those with a trapezoidal cross-sectional form. The patterning parameters explained above with reference to FIG. 3 can be applied to the elevations 26' of this second exemplary embodiment. In this case, the plane layer 35 between the active layer 14 of the multilayer structure 12 and the transparent layer 34 is to be used as reference variable for choosing the height of elevations 26', preferably to be twice as high as plane layer 35.

A further alternative embodiment of the semiconductor component of FIG. 1 is shown in FIG. 6. In the case of this semiconductor component 10, the multilayer structure 12 itself is not patterned. Rather an anti-reflection layer 32 applied on the second main area 18 of the multilayer structure 12 is provided with corresponding convex elevations 36.

Typical antireflection layers 32, for example made of $SiO_2$ or $SiN_x$, have a refractive index of less than 2, with the result that the radiation partly undergoes total reflection at the interface between semiconductor 12 and antireflection layer 32. As shown in the diagram of FIG. 3E, the effectiveness of the patterned antireflection layer 32 decreases significantly as the refractive index deviates increasingly from that of the semiconductor with 2.5. A patterned antireflection layer having a low refractive index may nevertheless be advantageous, however, since even a wave subjected to total reflection penetrates the material having a lower refractive index approximately to a depth of half the wavelength, although it decays exponentially in this case. The height of the patterned antireflection layer should therefore be no more than a few 100 nm and the lateral dimensions are in the micrometers range. Thus, for a height of the patterned anti-reflection layer no more than a few hundred nanometers (lower than half of the wavelengths), even waves subjected to total reflection can be coupled-out since those waves penetrate the anti-reflection layer approximately to a depth of half the wavelength.

If the lateral dimensions of the structures 36 of the antireflection layer 32 are reduced to the range of the wavelength of the radiation to be coupled out, an impinging wave is scattered at such a microstructure 36, as a result of which the beam is fanned out into a larger angular range.

Finally, FIG. 7 shows a further modification of the semiconductor component from FIG. 1. A transparent, conductive layer 38 made, for example, of ZnO, SnO, InO, CdO, GaO or a combination thereof is applied on the multilayer structure 12, which is not patterned in this case. Said transparent, conductive layer 38 is patterned analogously to the first exemplary embodiment from FIG. 1, FIG. 7 illustrating a one-dimensional patterning with elevations with a trapezoidal cross-sectional form.

The contact resistance between the transparent, conductive layer 38 and the semiconductor 12 should be as low as possible. If this is not the case, a metal layer (not illustrated) may be required between the layer 38 and the multilayer structure 12, said metal layer preferably being formed such that it is very thin and thus semitransparent or interrupted.

The scope of protection of the invention is not limited to the examples given hereinabove. The invention is embodied in each novel characteristic and each combination of characteristics, which includes every combination of any features which are stated in the claims, even if this combination of features is not explicitly stated in the claims.

The invention claimed is:

1. A radiation-emitting semiconductor device comprising:
   a reflective layer or interface; and
   a multilayer structure comprising:
      an active, radiation-generating layer;
      a first main area coupled to the reflective layer or interface; and
      a second main area remote from the first main area for coupling out the radiation generated in the active, radiation-generating layer,
   wherein the multilayer structure is an epitaxial layer structure, the semiconductor device is free of a deposition substrate of the multilayer structure, a region of the multilayer structure that adjoins the second main area of the multilayer structure is patterned one- or two-dimensionally to form convex elevations, and a height (h1) of the elevations is at least as large as a height (h2) of an unpatterned region of the multilayer structure that is between the active, radiation-generating layer and the elevations.

2. The semiconductor device as claimed in claim 1, wherein the elevations have the form of truncated pyramids or truncated cones or a trapezoidal cross-sectional form.

3. The semiconductor device as claimed in claim 1, wherein the elevations have the form of cones or a triangular cross-sectional form.

4. The semiconductor device as claimed in claim 1, wherein the elevations have the form of sphere segments or a circle segment cross-sectional form.

5. The semiconductor device as claimed in claim 1, wherein the elevations have an aperture angle ($\alpha$) of between approximately 30° and approximately 70°.

6. The semiconductor device as claimed in claim 5, wherein the elevations have an aperture angle ($\alpha$) of between approximately 40° and approximately 50°.

7. The semiconductor device as claimed in claim 1, wherein the height (h1) of the elevations is approximately twice as large as the height (h2) of the plane region of the multilayer structure between the active, radiation-generating layer and the elevations.

8. The semiconductor device as claimed in claim 1, wherein a grid dimension (d) of the elevations is at most approximately five times as large as the height (h1) of the elevations.

9. The semiconductor device as claimed in claim 8, wherein the grid dimension (d) of the elevations is at most approximately three times as large as the height (h1) of the elevations.

10. The semiconductor device as claimed in claim 1, wherein the reflective layer or interface coupled to the first main area of the multilayer structure has a reflectivity of at least 70%.

11. The semiconductor device as claimed in claim 1, wherein the reflective layer or interface coupled to the first main area of the multilayer structure has a reflectivity of at least 85%.

12. The semiconductor device as claimed claim 1, wherein the multilayer structure is applied by its first main area via the reflective layer on a carrier substrate or a carrier substrate forms the reflective interface with the first main area.

13. The semiconductor device as claimed in claim 12, wherein the reflective layer or the carrier substrate also serves as a contact area of the semiconductor device.

14. The semiconductor device as claimed claim 1, wherein a conductive, transparent layer is applied on the second main area of the multilayer structure.

15. The semiconductor device as claimed in claim 1, wherein a transparent protective layer is applied on the second main area of the multilayer structure.

16. The semiconductor device as claimed in claim 1, wherein the multilayer structure is based on GaN.

17. A radiation-emitting semiconductor device comprising:
a substantially planar reflective layer or interface, the reflective layer being applied on a carrier substrate or the reflective interface being formed by a carrier substrate; and
a multilayer structure comprising:
an active, radiation-generating layer;
a first main surface coupled to the reflective layer or interface; and
a second main surface remote from the first main surface for coupling out the radiation generated in the active, radiation-generating layer;
a transparent layer disposed between the first main surface of the multilayer structure and the reflective layer or interface, said transparent layer being patterned one- or two-dimensionally,
wherein the multilayer structure is an epitaxial layer structure, and the semiconductor device is free of a deposition substrate of the multilayer structure; and
wherein the transparent layer comprises convex elevations, the convex elevations tapering in a direction away from the first main surface of the multilayer structure to the reflective layer or interface.

18. The semiconductor device as claimed in claim 17, wherein the transparent layer is conductive.

19. The semiconductor device as claimed in claim 17, wherein the elevations have the form of truncated pyramids or truncated cones or a trapezoidal cross-sectional form.

20. The semiconductor device as claimed in claim 17, wherein the elevations have an aperture angle ($\alpha$) of between approximately 30° and approximately 70°.

21. The semiconductor device as claimed in claim 17, wherein the elevations have an aperture angle ($\alpha$) of between approximately 40° and approximately 50°.

22. The semiconductor device as claimed in claim 17, wherein the height (h1) of the elevations is at least as large as the height (h2) of a plane region of the multilayer structure between the active, radiation-generating layer and the elevations.

23. The semiconductor device as claimed in claim 22, wherein the height (h1) of the elevations is approximately twice as large as the height (h2) of the plane region of the multilayer structure between the active, radiation-generating layer and the elevations.

24. The semiconductor device as claimed in claim 17, a grid dimension (d) of the elevations is at most approximately five times as large as the height (h1) of the elevations.

25. The semiconductor device as claimed in claim 24, wherein the grid dimension (d) of the elevations is at most approximately three times as large as the height (h1) of the elevations.

26. The semiconductor device as claimed in claim 17, wherein the layer or interface coupled to the first main area of the multilayer structure has a reflectivity of at least 70%.

27. The semiconductor device as claimed in claim 26, wherein the layer or interface coupled to the first main area of the multilayer structure has a reflectivity of at least 85%.

28. The semiconductor device as claimed in claim 17, wherein the reflective layer or the carrier substrate also serves as a contact area of the semiconductor device.

29. The semiconductor device as claimed in claim 17, wherein a transparent protective layer is applied on the second main area of the multilayer structure.

30. The semiconductor device as claimed in claim 17, wherein the multilayer structure is based on GaN.

31. The semiconductor device as claimed in claim 17, wherein, due to the convex elevations, the transparent layer comprises first and second regions, the first regions having a thickness greater than a thickness of the second regions.

32. The semiconductor device as claimed in claim 17, wherein the active, radiation-generating layer is a continuous layer, and the transparent layer comprises a plurality of elevations that overlap with the active, radiation-generating layer.

* * * * *